(12) United States Patent
Chen et al.

(10) Patent No.: US 10,658,976 B1
(45) Date of Patent: May 19, 2020

(54) LOW POWER CRYSTAL OSCILLATOR

(71) Applicant: UNITED MICROELECTRONICS CORP., Hsin-Chu (TW)

(72) Inventors: Ke-Han Chen, Yunlin County (TW); Min-Chia Wang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/421,492

(22) Filed: May 24, 2019

(30) Foreign Application Priority Data

May 7, 2019 (CN) .......................... 2019 1 0374396

(51) Int. Cl.
*H03B 5/36* (2006.01)
*H03L 5/00* (2006.01)
*H03B 5/12* (2006.01)
*H03B 5/06* (2006.01)

(52) U.S. Cl.
CPC .............. *H03B 5/364* (2013.01); *H03B 5/06* (2013.01); *H03B 5/1228* (2013.01); *H03L 5/00* (2013.01); *H03B 2200/0082* (2013.01)

(58) Field of Classification Search
CPC ........... H03L 5/00; H03B 5/06; H03B 5/1228; H03B 5/364; H03B 2200/0082

USPC ....................................... 331/158, 116 FE, 74
See application file for complete search history.

(56) References Cited

U.S. PATENT DOCUMENTS

| 7,123,113 B1* | 10/2006 | Brennan | .................. H03L 5/00 331/158 |
| 2017/0149437 A1* | 5/2017 | Luo | ........................ H03L 7/099 |

FOREIGN PATENT DOCUMENTS

CN          203457106 U     2/2014

\* cited by examiner

*Primary Examiner* — Arnold M Kinkead
(74) *Attorney, Agent, or Firm* — Winston Hsu

(57) ABSTRACT

A crystal oscillator with a configuration that allows for reduction of power consumption includes a crystal element, a first transistor, a second transistor, a third transistor, a fourth transistor, a fifth transistor, a sixth transistor, a seventh transistor, an eighth transistor, a ninth transistor, a crystal element. The crystal element includes a first terminal coupled to a control terminal of the seventh transistor and a second terminal coupled to a first terminal of the seventh transistor. The second transistor includes a control terminal coupled to an output terminal of the crystal oscillator and a first terminal of the ninth transistor.

13 Claims, 3 Drawing Sheets

LOW POWER CRYSTAL OSCILLATOR

BACKGROUND OF THE INVENTION

1. Field of the Invention

The present invention is related to a crystal oscillator, and more particularly to a crystal oscillator capable of effectively reducing power consumption.

2. Description of the Prior Art

Crystal oscillators are used to generate clock signals, and are widely applied in consumer products such as computers, peripheral devices, tablets, mobile phones, etc. Crystal oscillators play a pivotal role in electronics. Depending on the type of crystal, a crystal oscillator can be embedded in the hardware circuit design or in an integrated circuit. In these applications, many require accurate and stable oscillation frequency. More manufacturers are paying attention to the crystal oscillator circuits. As electronic products continue to shrink in size, the power consumption of crystal oscillators must be strictly controlled in order to be used in low-power integrated circuits. Therefore, it is necessary to propose a design that can reduce the power consumption of the crystal oscillator.

SUMMARY OF THE INVENTION

An embodiment of the present invention provides a crystal oscillator including a first transistor, a second transistor, a third transistor, a fourth transistor, a fifth transistor, a sixth transistor, a seventh transistor, an eighth transistor, a ninth transistor, a crystal element. The crystal element includes a first terminal coupled to a control terminal of the seventh transistor and a second terminal coupled to a first terminal of the seventh transistor. The second transistor includes a control terminal coupled to an output terminal of the crystal oscillator and a first terminal of the ninth transistor. This configuration can effectively reduce the power consumption of the crystal oscillator.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
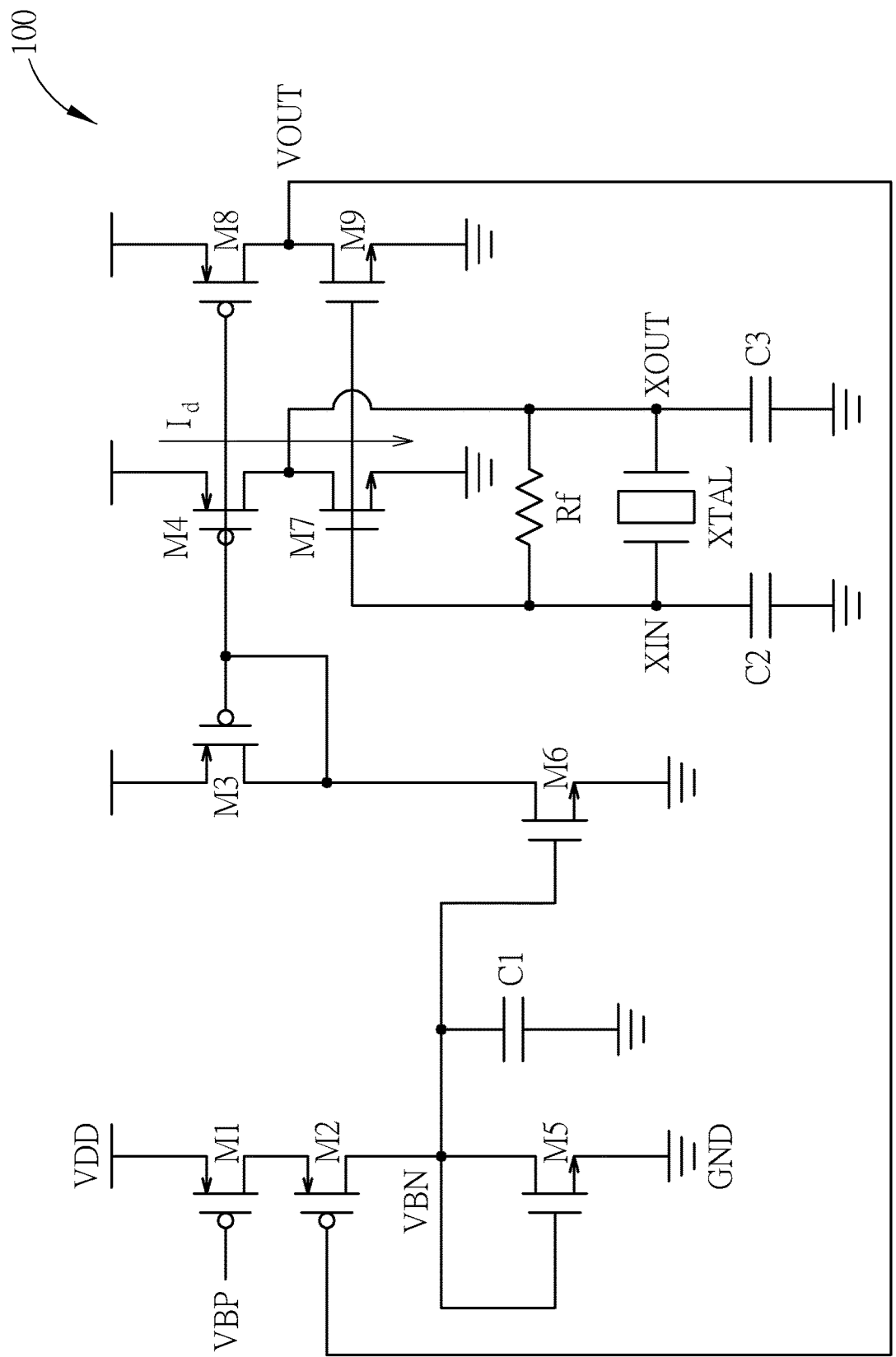
FIG. 1 is a diagram of a crystal oscillator of an embodiment.

FIG. 1 is a diagram of a crystal oscillator 100 according to an embodiment of the present invention. The crystal oscillator 100 comprises a first transistor M1, a second transistor M2, a third transistor M3, a fourth transistor M4, a fifth transistor M5, a sixth transistor M6, a seventh transistor M7, an eighth transistor M8, a ninth transistor M9, a crystal element XTAL, a first capacitor C1, a second capacitor C2, a third capacitor C3, and an isolation resistor Rf.

The first transistor M1 includes a first terminal coupled to the first reference terminal VDD, a second terminal and a control terminal coupled to the first bias terminal VBP. The second transistor M2 includes a first terminal coupled to the second terminal of the first transistor M1, a second terminal coupled to the second bias terminal VBN and a control terminal coupled to the output terminal VOUT of the crystal oscillator 100. The third transistor M3 includes a first terminal coupled to the first reference terminal VDD, a second terminal, and a control terminal. The fourth transistor M4 includes a first terminal coupled to the first reference terminal VDD, a second terminal and a control terminal coupled to the control terminal of the third transistor M3. The fifth transistor M5 includes a first terminal coupled to the second bias terminal VBN, a second terminal coupled to the second reference terminal GND, and a control terminal coupled to the second bias terminal VBN. The sixth transistor M6 includes a first terminal coupled to the second terminal of the third transistor M3, a second terminal coupled to the second reference terminal GND, and a control terminal coupled to the second bias terminal VBN. The seventh transistor M7 includes a first terminal coupled to the second terminal of the fourth transistor M4, and a second terminal coupled to the second reference terminal GND and a control terminal. The eighth transistor M8 includes a first terminal coupled to the first reference terminal VDD, a second terminal coupled to the output terminal VOUT and a control terminal coupled to the control terminal of the third transistor M3. The ninth transistor M9 includes a first terminal coupled to the output terminal VOUT, a second terminal coupled to the second reference terminal GND, and a control terminal coupled to the control terminal of the seventh transistor M7. The crystal element XTAL includes a first terminal XIN coupled to the control terminal of the seventh transistor M7 and a second terminal XOUT coupled to the first terminal of the seventh transistor M7.

The first transistor M1, the second transistor M2, the third transistor M3, the fourth transistor M4, and the eighth transistor M8 may be P-type transistors. The fifth transistor M5, the sixth transistor M6, the seventh transistor M7, and the ninth transistor M9 may be N-type transistors.

The first capacitor C1 includes a first terminal coupled to the second bias terminal VBN and a second terminal coupled to the second reference terminal GND. The second capacitor C2 includes a first terminal coupled to the first terminal XIN of the crystal element XTAL and a second terminal coupled to the second reference terminal GND. The third capacitor C3 includes a first terminal coupled to the second terminal XOUT of the crystal element XTAL and a second terminal coupled to the second reference terminal GND. The isolation resistor Rf includes a first terminal coupled to the first terminal XIN of the crystal element XTAL and a second terminal coupled to the second terminal XOUT of the crystal element XTAL.

Figure 2:
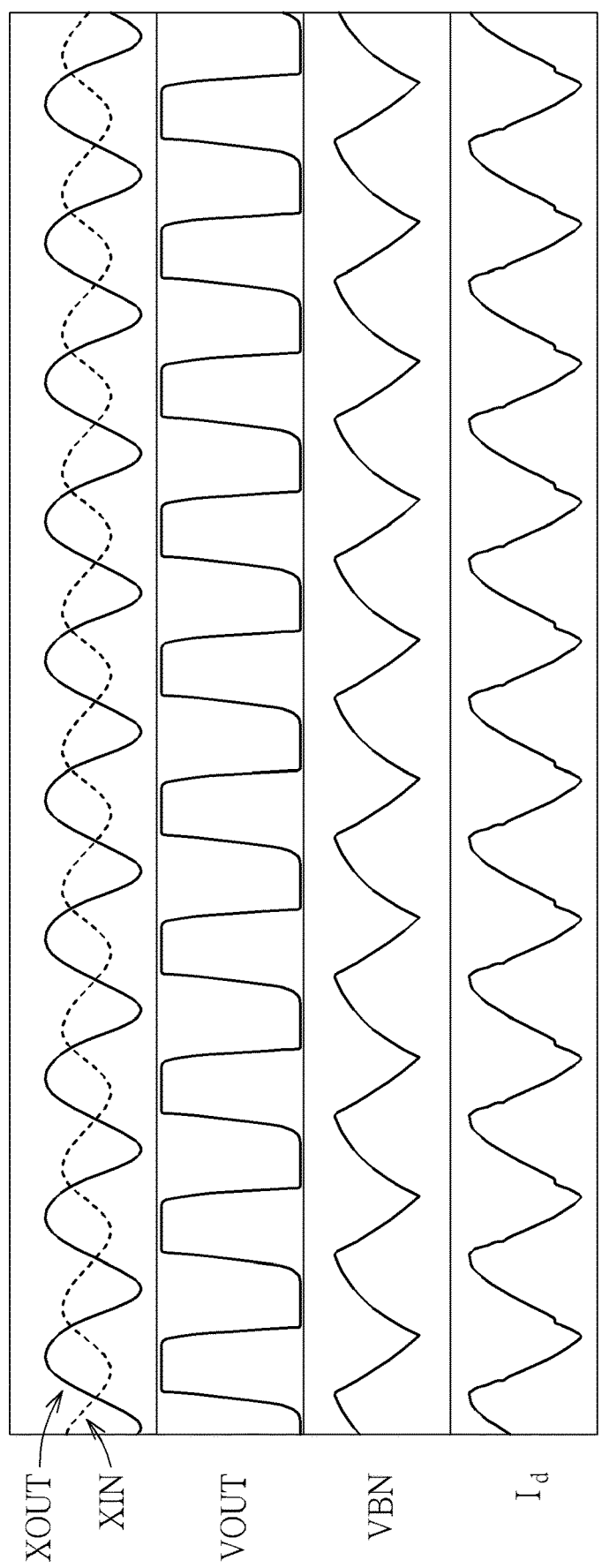
FIG. 2 is an operation signal diagram of the crystal oscillator of FIG. 1.

FIG. 2 is an operation signal diagram of the crystal oscillator of FIG. 1. The vertical axis represents voltage and the horizontal axis represents time. The operating principle of the crystal oscillator 100 is described as follows. When the output terminal VOUT of the crystal oscillator 100 is at low voltage, the second transistor M2 would be turned on. The first bias terminal VBP provides a voltage for controlling the magnitude of the current flowing through the first transistor M1. The current flows from the first reference terminal VDD to the first capacitor C1 so as to charge the first capacitor C1. While the first capacitor C1 is charging, the voltage at the second bias terminal VBN increases at the same time. By adjusting the voltage at the first bias terminal VBP, the maximum voltage at the second bias terminal VBN is set to be lower than the voltage at first reference terminal VDD. Meanwhile a current flows from the first reference terminal VDD through the third transistor M3 and the sixth transistor M6 to the second reference terminal GND. The magnitude of this current is controlled by the voltage at the second bias terminal VBN. The third transistor M3 and the fourth transistor M4 form a current mirror. As the operating principle of current mirror indicates, a driving current $I_d$ would flow from the first reference terminal VDD through the fourth transistor M4 and the seventh transistor M7 to the second reference terminal GND. The seventh transistor M7, as an inverting amplifier operating at the transition region with a voltage gain, drives the crystal element XTAL to generate a current causing the voltage at the second terminal XOUT to increase. The eighth transistor M8 and the ninth transistor M9 form a common source amplifier which amplifies the signal at the second terminal XOUT and as the result the voltage of the output terminal VOUT would also increase. The crystal element XTAL, the second capacitor C2 and the third capacitor C3 form a band pass filter, which can filter the noise generated by crystal oscillation. The isolation resistor Rf can reduce the drive level of the crystal element XTAL to prevent it from premature breakdown.

When the voltage at the second terminal XOUT of the crystal element XTAL reaches a certain amplitude, the output terminal VOUT would reach and maintain at a high voltage level. At this time, the second transistor M2 is turned off, and the first capacitor C1 discharges to the second reference terminal GND causing the voltage at the second bias terminal VBN to decrease. The voltage drop at the second bias terminal VBN causes the magnitude of current flowing through the sixth transistor M6 to decrease. By the principle of current mirror, the magnitude the driving current $I_d$ would also decrease and as the result the voltage at the second terminal XOUT of the crystal element XTAL would decrease. The common source amplifier formed by the eighth transistor M8 and the ninth transistor M9 amplifies the signal of the second terminal XOUT causing the voltage of the output terminal VOUT to decrease. When the voltage at the second terminal XOUT of the crystal element XTAL drops to a certain amplitude, the output terminal VOUT of the crystal oscillator 100 would reach and maintain at a low voltage level. At this time, the second transistor M2 is turned on again allowing the first capacitor C1 to charge. The voltage at the second bias terminal VBN and the magnitude of the driving current $I_d$ would increase again. The operation repeats itself making the output terminal VOUT of the crystal oscillator 100 to output a square wave clock signal. Comparing with the prior art, in the embodiment the magnitude of the driving current is much lower, which means lower power consumption of the circuit.

Figure 3:
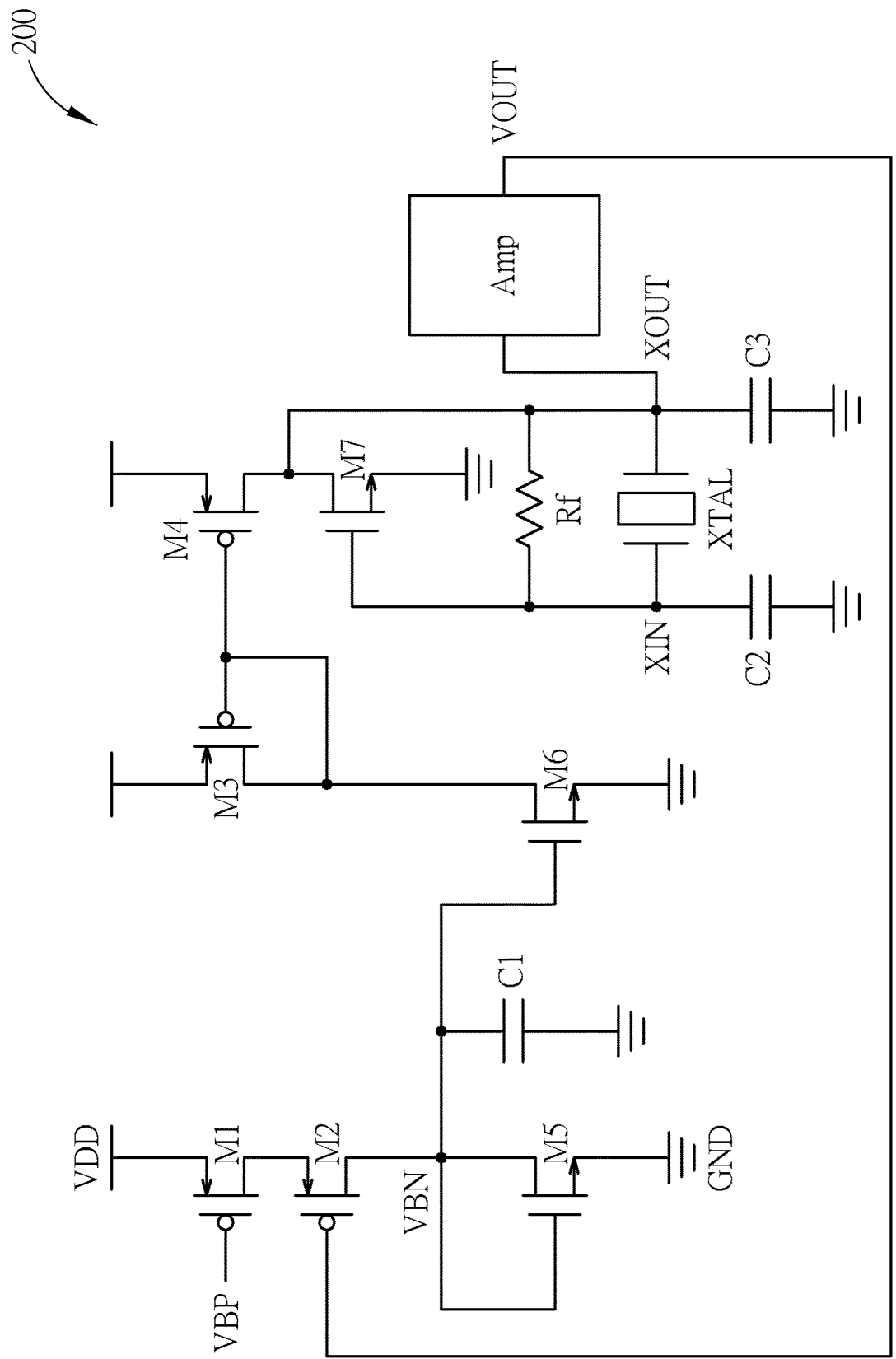
FIG. 3 is a diagram of a crystal oscillator of another embodiment.

FIG. 3 is a diagram of a crystal oscillator 200 of another embodiment. The difference between the crystal oscillator 100 and the crystal oscillator 200 is that the eighth transistor M8 and the ninth transistor M9 are replaced with an amplifier Amp configured to amplify the sinusoidal wave signal generated by the oscillation of the crystal element XTAL to become a square wave. The amplifier Amp includes an input terminal and an output terminal. The input terminal is coupled to the second terminal XOUT of the crystal element XTAL, and the output terminal is coupled to the output terminal VOUT of the oscillator 200. The amplifier Amp can be a multistage transistor amplifier. The operating principle of the crystal oscillator 200 and the crystal oscillator 100 is substantially the same, so the description would not repeated herein.

In summary, the crystal oscillator of the embodiment of the present invention uses the piezoelectric effect of the crystal to generate a high-precision oscillation frequency. Compared with the prior art, the crystal oscillator of the present invention can effectively reduce the power consumption by controlling the voltage at the bias terminals of the circuit. This solves the problem of large power consumption by crystal oscillators of present technology. It can be expanded and applied to products with low-power integrated circuits, such as microprocessors and radio frequency chips, to realize the next-generation wireless communication.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator comprising:
   a first transistor comprising a first terminal coupled to a first reference terminal, a second terminal, and a control terminal coupled to a first bias terminal;
   a second transistor comprising a first terminal coupled to the second terminal of the first transistor, a second terminal coupled to a second bias terminal, and a control terminal coupled to an output terminal of the crystal oscillator;
   a third transistor comprising a first terminal coupled to the first reference terminal, a second terminal, and a control terminal;
   a fourth transistor comprising a first terminal coupled to the first reference terminal, a second terminal, and a control terminal coupled to the control terminal of the third transistor;
   a fifth transistor comprising a first terminal coupled to the second bias terminal, a second terminal coupled to a second reference terminal, and a control terminal coupled to the second bias terminal;
   a sixth transistor comprising a first terminal coupled to the second terminal of the third transistor, a second terminal coupled to the second reference terminal, and a control terminal coupled to the second bias terminal;
   a seventh transistor comprising a first terminal coupled to the second terminal of the fourth transistor, a second terminal coupled to the second reference terminal, and a control terminal;
   an eighth transistor comprising a first terminal coupled to the first reference terminal, a second terminal coupled to the output terminal of the crystal oscillator, and a control terminal coupled to the control terminal of the third transistor;
   a ninth transistor comprising a first terminal coupled to the output terminal of the crystal oscillator, a second terminal coupled to the second reference terminal, and a control terminal coupled to the control terminal of the seventh transistor; and
   a crystal element comprising a first terminal coupled to the control terminal of the seventh transistor, and a second terminal coupled to the first terminal of the seventh transistor.

2. The crystal oscillator of claim 1 further comprising:
   a first capacitor comprising a first terminal coupled to the second bias terminal, and a second terminal coupled to the second reference terminal;
   a second capacitor comprising a first terminal coupled to the first terminal of the crystal element, and a second terminal coupled to the second reference terminal;

a third capacitor comprising a first terminal coupled to the second terminal of the crystal element, and a second terminal coupled to the second reference terminal; and an isolation resistor comprising a first terminal coupled to the first terminal of the crystal element, and a second terminal coupled to the second terminal of the crystal element.

3. The crystal oscillator of claim 1, wherein the first transistor, the second transistor, the third transistor, the fourth transistor, and the eighth transistor are P-type transistors.

4. The crystal oscillator of claim 1, wherein the fifth transistor, the sixth transistor, the seventh transistor, and the ninth transistor are N-type transistors.

5. The crystal oscillator of claim 1, wherein the crystal element is composed of a piezoelectric material for generating a high-accuracy oscillation frequency.

6. The crystal oscillator of claim 1, wherein the first reference terminal is configured to provide a system voltage and the second reference terminal is a ground terminal.

7. A crystal oscillator comprising:
a first transistor comprising a first terminal coupled to a first reference terminal, a second terminal, and a control terminal coupled to a first bias terminal;
a second transistor comprising a first terminal coupled to the second terminal of the first transistor, a second terminal coupled to a second bias terminal, and a control terminal coupled to an output terminal of the crystal oscillator;
a third transistor comprising a first terminal coupled to the first reference terminal, a second terminal, and a control terminal;
a fourth transistor comprising a first terminal coupled to the first reference terminal, a second terminal, and a control terminal coupled to the control terminal of the third transistor;
a fifth transistor comprising a first terminal coupled to the second bias terminal, a second terminal coupled to a second reference terminal, and a control terminal coupled to the second bias terminal;
a sixth transistor comprising a first terminal coupled to the second terminal of the third transistor, a second terminal coupled to the second reference terminal, and a control terminal coupled to the second bias terminal;
a seventh transistor comprising a first terminal coupled to the second terminal of the fourth transistor, a second terminal coupled to the second reference terminal, and a control terminal;
a crystal element comprising a first terminal coupled to the control terminal of the seventh transistor, and a second terminal coupled to the first terminal of the seventh transistor; and
an amplifier comprising an input terminal coupled to the second terminal of the crystal element, and an output terminal coupled to the output terminal of the crystal oscillator.

8. The crystal oscillator of claim 7 further comprising:
a first capacitor comprising a first terminal coupled to the second bias terminal, and a second terminal coupled to the second reference terminal;
a second capacitor comprising a first terminal coupled to the first terminal of the crystal element, and a second terminal coupled to the second reference terminal;
a third capacitor comprising a first terminal coupled to the second terminal of the crystal element, and a second terminal coupled to the second reference terminal; and
an isolation resistor comprising a first terminal coupled to the first terminal of the crystal element, and a second terminal coupled to the second terminal of the crystal element.

9. The crystal oscillator of claim 7, wherein the amplifier is a multistage transistor amplifier.

10. The crystal oscillator of claim 7, wherein the first transistor, the second transistor, the third transistor, and the fourth transistor are P-type transistors.

11. The crystal oscillator of claim 7, wherein the fifth transistor, the sixth transistor, and the seventh transistor are N-type transistors.

12. The crystal oscillator of claim 7, wherein the crystal element is composed of a piezoelectric material for generating a high-accuracy oscillation frequency.

13. The crystal oscillator of claim 7, wherein the first reference terminal is configured to provide a system voltage and the second reference terminal is a ground terminal.

* * * * *